United States Patent
Park et al.

(10) Patent No.: US 11,243,465 B2
(45) Date of Patent: Feb. 8, 2022

(54) PLASMA TREATMENT METHOD TO ENHANCE SURFACE ADHESION FOR LITHOGRAPHY

(71) Applicant: Tokyo Electron Limited, Tokyo (JP)

(72) Inventors: Wanjae Park, Albany, NY (US); Lior Huli, Albany, NY (US); Soo Doo Chae, Albany, NY (US)

(73) Assignee: TOKYO ELECTRON LIMITED, Tokyo (JP)

(*) Notice: Subject to any disclaimer, the term of this patent is extended or adjusted under 35 U.S.C. 154(b) by 291 days.

(21) Appl. No.: 16/221,030

(22) Filed: Dec. 14, 2018

(65) Prior Publication Data

US 2019/0187556 A1 Jun. 20, 2019

Related U.S. Application Data

(60) Provisional application No. 62/607,143, filed on Dec. 18, 2017, provisional application No. 62/714,045, filed on Aug. 2, 2018.

(51) Int. Cl.
*G03F 7/00* (2006.01)
*G03F 7/20* (2006.01)
(Continued)

(52) U.S. Cl.
CPC .......... *G03F 7/0002* (2013.01); *G03F 7/0752* (2013.01); *G03F 7/091* (2013.01);
(Continued)

(58) Field of Classification Search
CPC ...... G03F 7/0002; G03F 7/0752; G03F 7/091; G03F 7/11; G03F 7/16; G03F 7/2022; G03F 7/70033; H01L 21/0274; H01L 21/0276
(Continued)

(56) References Cited

U.S. PATENT DOCUMENTS 6,174,816 B1 * 1/2001 Yin .................. H01L 21/0276
257/E21.029
6,686,272 B1 * 2/2004 Lee .................. H01L 21/31633
438/636
(Continued)

FOREIGN PATENT DOCUMENTS

JP 2017045869 A 3/2017

OTHER PUBLICATIONS

Ogawa, Plasma Treatement Method, Mar. 2, 2017, JP2017045869 English Machine Translation, (Para, 0031).*

(Continued)

*Primary Examiner* — Caleen O Sullivan
(74) *Attorney, Agent, or Firm* — Weihrouch IP

(57) ABSTRACT

Embodiments of methods for patterning using enhancement of surface adhesion are presented. In an embodiment, a method for patterning using enhancement of surface adhesion may include providing an input substrate with an anti-reflective coating layer and an underlying layer. Such a method may also include performing a surface adhesion modification process on the substrate, the surface adhesion modification process utilizing a plasma treatment configured to increase an adhesion property of an anti-reflective coating layer without affecting downstream processes. In an embodiment, the method may also include performing a photoresist coating process, a mask exposure process, and a developing process to generate a target patterned structure in a photoresist layer on the substrate. In such embodiments, the method may include controlling operating parameters of the surface adhesion modification process to achieve target profiles of the patterned structure and substrate throughput objectives.

20 Claims, 8 Drawing Sheets

(51) Int. Cl.
*H01L 21/027* (2006.01)
*G03F 7/075* (2006.01)
*G03F 7/09* (2006.01)
*G03F 7/11* (2006.01)
*G03F 7/16* (2006.01)

(52) U.S. Cl.
CPC ............... *G03F 7/11* (2013.01); *G03F 7/16* (2013.01); *G03F 7/2022* (2013.01); *G03F 7/70033* (2013.01); *H01L 21/0274* (2013.01); *H01L 21/0276* (2013.01)

(58) Field of Classification Search
USPC .......................................... 430/327
See application file for complete search history.

(56) References Cited

U.S. PATENT DOCUMENTS

| | | | |
|---|---|---|---|
| 2001/0003606 A1* | 6/2001 | Kou | G03F 7/091 427/569 |
| 2002/0031726 A1* | 3/2002 | Hsieh | G03F 7/091 430/312 |
| 2002/0034008 A1* | 3/2002 | Ohishi | G02B 5/0278 359/488.01 |
| 2004/0058515 A1* | 3/2004 | Kwon | H01L 21/0337 438/552 |
| 2006/0057507 A1* | 3/2006 | Chang | G03F 7/091 430/327 |
| 2008/0081480 A1* | 4/2008 | Frohberg | H01L 21/76829 438/703 |
| 2008/0160458 A1 | 7/2008 | Van Ingen Schenau et al. | |
| 2009/0197086 A1 | 8/2009 | Rathi et al. | |
| 2011/0111604 A1 | 5/2011 | Kim et al. | |

OTHER PUBLICATIONS

Written Opinion in corresponding International Application No. PCT/US2018/065767 dated Apr. 10, 2019 (7 pp).
International Search Report in corresponding International Application No. PCT/US2018/065767 dated Apr. 10, 2019 (3pp).

\* cited by examiner

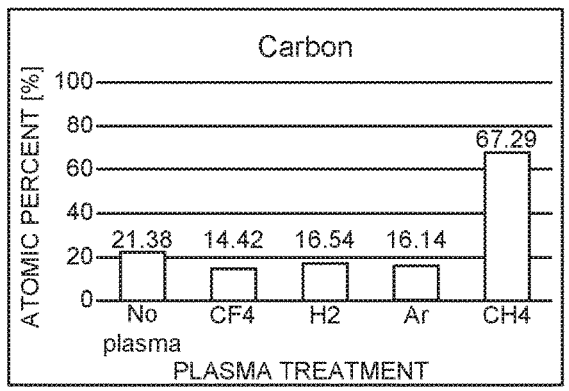
FIG. 5A
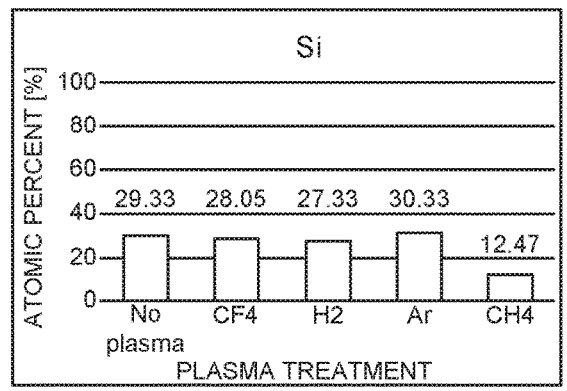
FIG. 5B
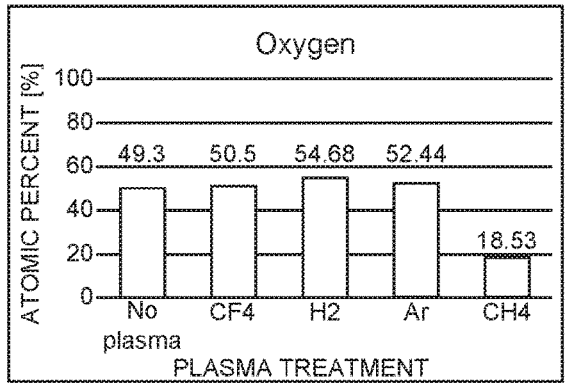
FIG. 5C
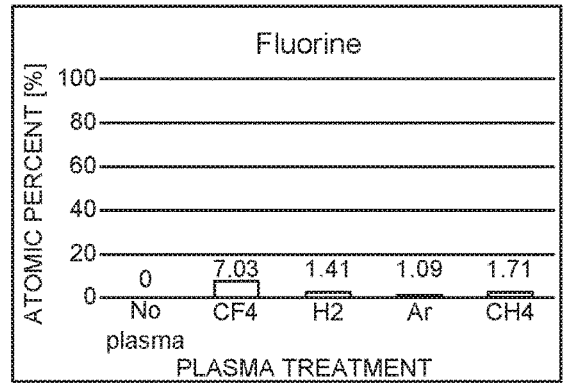
FIG. 5D
| Etch | Element | A% |
|---|---|---|
| No Etch | O | 49 |
| | C | 21 |
| | Si | 29 |
| CF$_4$ | O | 51 |
| | C | 14 |
| | Si | 28 |
| | F | 7 |
| H$_2$ | O | 55 |
| | C | 17 |
| | Si | 27 |
| | F | 1 |
| Ar | O | 52 |
| | C | 16 |
| | Si | 30 |
| | F | 1 |
| CH$_4$ | O | 19 |
| | C | 67 |
| | Si | 12 |
| | F | 2 |
FIG. 5E

PLASMA TREATMENT METHOD TO ENHANCE SURFACE ADHESION FOR LITHOGRAPHY

CROSS-REFERENCE TO RELATED APPLICATIONS

This application claims priority to U.S. Provisional Patent Application No. 62/607,143 entitled "Plasma treatment method for the improvement of pattern collapse", filed on Dec. 18, 2017 and U.S. Provisional Patent Application No. 62/714,045 entitled "Plasma Treatment Method To Enhance Surface Adhesion For Lithography", filed on Aug. 2, 2018 the entire contents of which are incorporated herein by reference.

BACKGROUND

Field of Invention

The present disclosure relates to the processing of substrates, such as for example, semiconductor substrates. In particular, it provides a method to improve multi-patterning processing of substrates.

Description of Related Art

This described embodiments relate processes for patterning of semiconductor substrates. Patterning methods are important aspects of semiconductor processing. Extreme ultraviolet (EUV) lithography has been investigated to extend lithographic technology beyond its optical limits and replace current photolithography methods to pattern tiny critical dimension (CD) features. As the feature size is reduced, the adhesion between photo resist (PR) and its under layer such as silicon containing anti-reflective coating layer (Si-ARC) is getting worse. Current lithography methods including EUV and argon fluoride PR show pattern collapse or flop-over issues that may ultimately render the substrate useless.

For example, FIGS. 1A-1D illustrate a prior art lithography process. In the example of FIG. 1, a plasma treatment system, such as the system illustrated in FIG. 2, may receive a workpiece comprising an underlayer 102, such as a silicon or germanium substrate. The underlayer 102 may have additional layers formed thereon, including for example, a spin-on-carbon (SOC) layer 104. In an embodiment, the SOC layer 104 may be organic dielectric and/or an organic planarization layer. Additionally, the workpiece may include an anti-reflective layer 106, such as a silicon containing anti-reflective coating (Si-ARC) layer. A photoresist coating 108 may be deposited on the anti-reflective layer, for example by spinning a polymer photoresist material thereon. In an embodiment, the photoresist layer includes an argon fluoride material. The photoresist layer 108 may be exposed to patterned ultraviolet (UV) light, where the patterning is achieved with a mask device 110. In a further embodiment, the photoresist 108 may include an extreme UV (EUV) material. After exposure, a portion of the photoresist layer 108 may be removed by washing or etching away the portions of the photoresist 108 that were not exposed to the UV light. The process of FIG. 1 is deficient for several reasons. For example, common problems with the process of FIG. 1 include pattern lifting, line/line merging, open or broken lines, or failure to create patterns completely.

In prior lithography processes, patterns are printed by emitting photons from a photon source onto a mask and printing the pattern onto a photosensitive photoresist, thereby causing a chemical reaction in the photoresist that, after development, removes certain portions of the photoresist to form the pattern. If the adhesion between photoresist coating 108 and under layer such as silicon containing ARC (Si-ARC) 106 is poor, then the pattern collapses or no pattern is formed after the develop process. This pattern collapse may be more observed, as the feature size is smaller due to smaller contact surface topographically. The missing pattern issue can be directly correlated with the production yield. An effective method to reduce the pattern collapse or missing pattern is important for development of current processing techniques.

SUMMARY

Embodiments of methods and systems for patterning using enhancement of surface adhesion are presented. In an embodiment, a method for patterning using enhancement of surface adhesion may include providing an input substrate with an anti-reflective coating layer and an underlying layer. Such a method may also include performing a surface adhesion modification process on the substrate, the surface adhesion modification process utilizing a plasma treatment configured to increase an adhesion property of an anti-reflective coating layer without affecting downstream processes. In an embodiment, the method may also include performing a photoresist coating process, a mask exposure process, and a developing process to generate a target patterned structure in a photoresist layer on the substrate. In such embodiments, the method may include controlling operating parameters of the surface adhesion modification process to achieve target profiles of the patterned structure and substrate throughput objectives.

In another embodiment, a method may include providing an input substrate with an adhesion layer and an underlying layer. Such a method may also include performing a surface adhesion modification process on the substrate, the adhesion modification process utilizing a plasma treatment configured to increase of adhesion property of the adhesion layer without affecting downstream processes. The method may also include performing a photoresist coating process, a mask exposure process, and a developing process to generate a target patterned structure in a photoresist layer on the substrate. Such embodiments may include controlling operating parameters of the surface adhesion modification process to achieve target profiles of the patterned structure and reduced pattern lifting, line merging, open line, and/or line without a pattern.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

FIG. 5A is a graphical representation of XPS results (Atomic %) for one embodiment of a plasma treatment chemistry.

FIG. 5B is a graphical representation of XPS results (Atomic %) for one embodiment of a plasma treatment chemistry.

FIG. 5C is a graphical representation of XPS results (Atomic %) for one embodiment of a plasma treatment chemistry.

FIG. 5D is a graphical representation of XPS results (Atomic %) for one embodiment of a plasma treatment chemistry.

FIG. 5E is a graphical representation of XPS results (Atomic %) for one embodiment of a plasma treatment chemistry.

DETAILED DESCRIPTION

Although the concepts disclosed herein have been described within the exemplary embodiment of a multi-patterning process, it will be recognized that the techniques may be utilized at other stages of substrate processing. In this manner, it will be recognized by those skilled in the art (after having the benefit of the disclosure provided herein) that the techniques described may be utilized in a variety of manners during substrate processing.

It will be recognized that the layers, and the materials that comprise the layers, that are described herein are merely exemplary. However, other materials may be utilized and the concepts described herein may be implemented without even using such layers. Further, it will be recognized that the various process layers and structures shown may be utilized with additional intervening process layers and coatings as would be understood by those in the art. Thus, for example, more or less materials may be utilized between the SiARC and the underlying layer and within the underlying layer.

The embodiments of systems and methods for plasma treatment to enhance surface adhesion for lithography described herein resolve the shortcomings of the process of FIG. 1 by, among others, providing a process for increasing adhesion of the anti-reflective coating to promote improved or enhanced adhesion between the anti-reflective coating and the photoresist coating, and thereby improving the resulting patterning of the photoresist coating by reducing the pattern lifting, line/line merging, open or broken lines, or failure to create patterns.

Figure 1A:
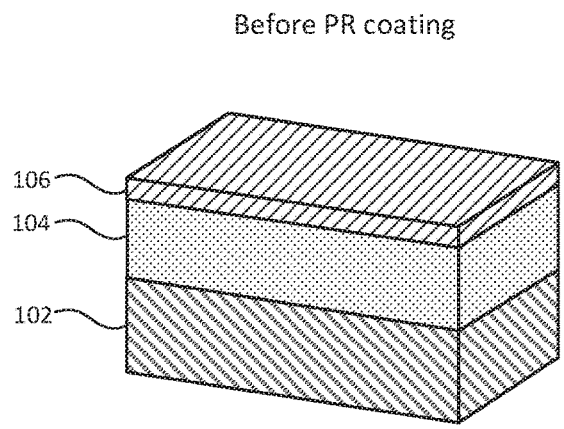
FIG. 1A illustrates an example of a prior art structure and process flow utilized during a lithography process.
Figure 1B:
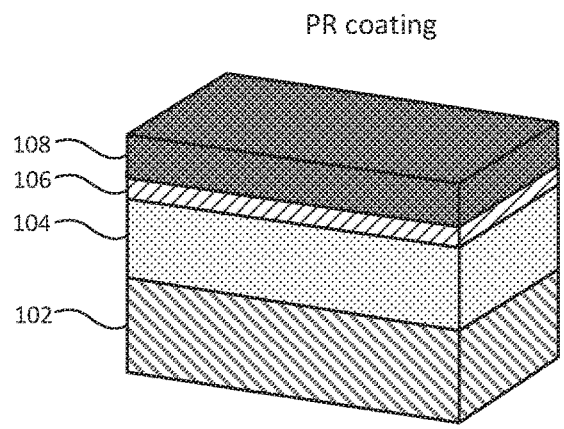
FIG. 1B illustrates an example of a prior art structure and process flow utilized during a lithography process.
Figure 1C:
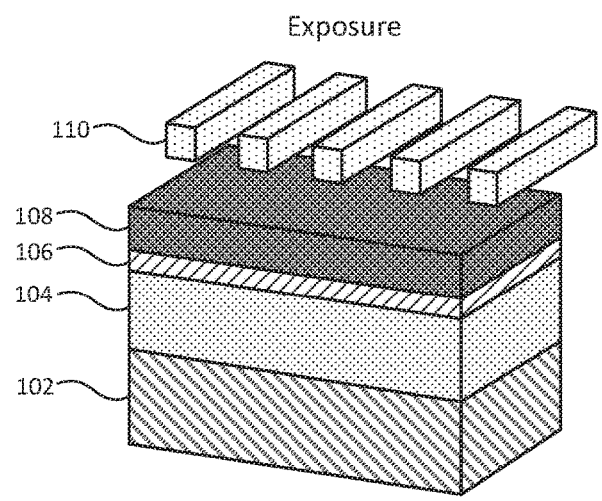
FIG. 1C illustrates an example of a prior art structure and process flow utilized during a lithography process.
Figure 1D:
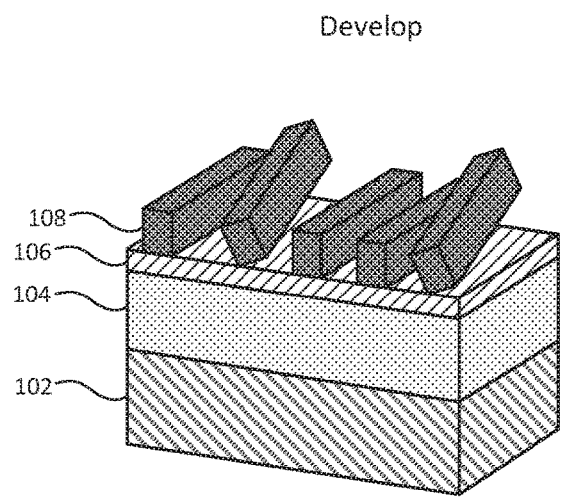
FIG. 1D illustrates an example of a prior art structure and process flow utilized during a lithography process.
Figure 2:
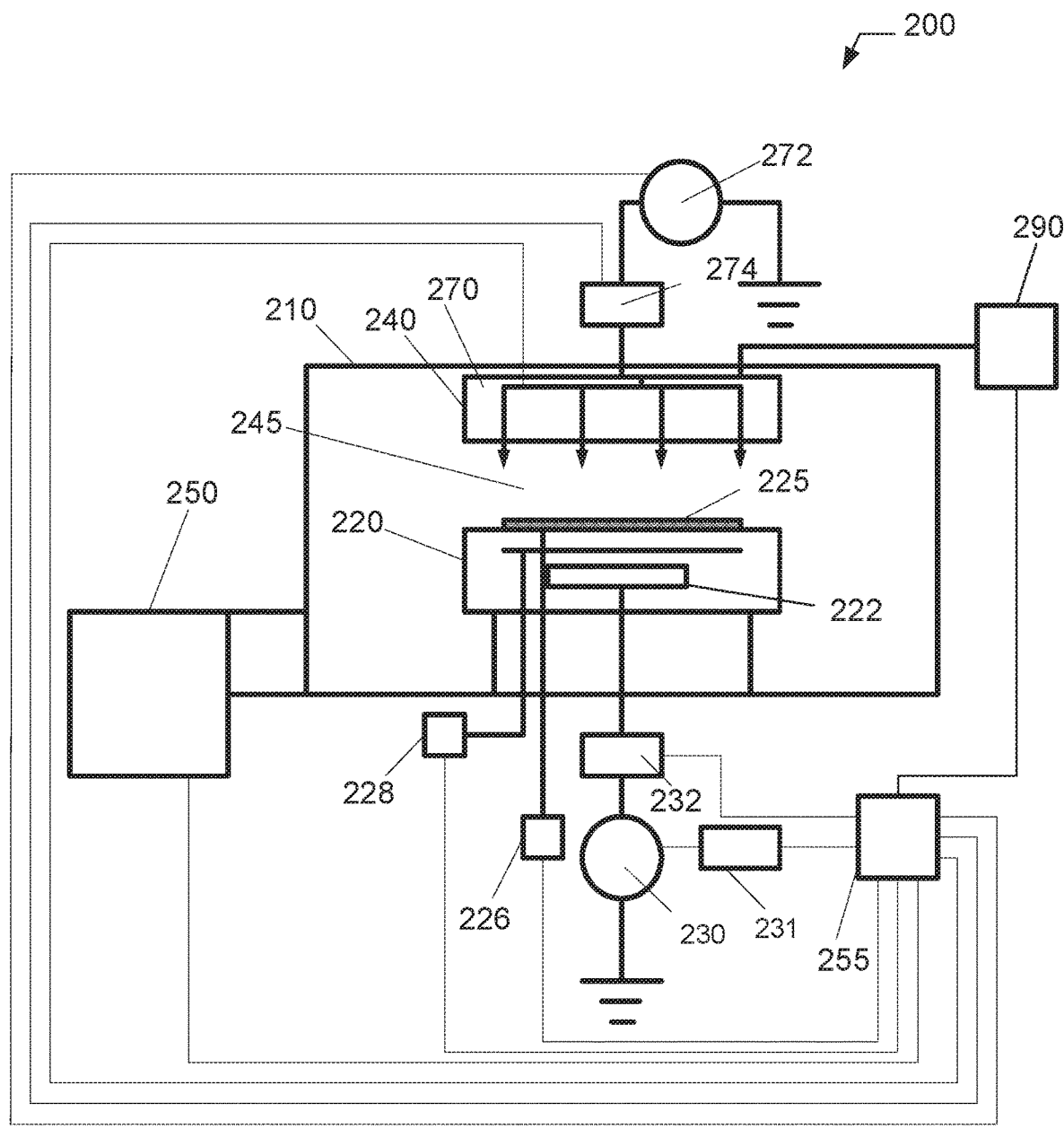
FIG. 2 is a schematic block diagram illustrating one embodiment of a system for plasma treatment to enhance surface adhesion for lithography.

FIG. 2 is an embodiment of a system 200 for plasma treatment to enhance surface adhesion for lithography. In a further embodiment, the system 200 may be configured to perform plasma treatment to enhance surface adhesion as described with reference to FIGS. 3-11. An etch and post heat treatment system 200 configured to perform the above identified process conditions is depicted in FIG. 2 comprising a processing chamber 210, substrate holder 220, upon which a wafer 225 to be processed is affixed, and vacuum pumping system 250. The wafer 225 can be a semiconductor substrate, a wafer, a flat panel display, or a liquid crystal display. Processing chamber 210 can be configured to facilitate etching the processing region 245 in the vicinity of a surface of the wafer 225. An ionizable gas or mixture of process gases is introduced via a gas distribution system 240. For a given flow of process gas, the process pressure is adjusted using the vacuum pumping system 250.

The wafer 225 can be affixed to the substrate holder 220 via a clamping system (not shown), such as a mechanical clamping system or an electrical clamping system (e.g., an electrostatic clamping system). Furthermore, substrate holder 220 can include a heating system (not shown) or a cooling system (not shown) that is configured to adjust and/or control the temperature of substrate holder 220 and the wafer 225. The heating system or cooling system may comprise a re-circulating flow of heat transfer fluid that receives heat from substrate holder 220 and transfers heat to a heat exchanger system (not shown) when cooling, or transfers heat from the heat exchanger system to substrate holder 220 when heating. In other embodiments, heating/cooling elements, such as resistive heating elements, or thermo-electric heaters/coolers can be included in the substrate holder 220, as well as the chamber wall of the processing chamber 210 and any other component within the processing system 200.

Additionally, a heat transfer gas can be delivered to the backside of wafer 225 via a backside gas supply system 226 in order to improve the gas-gap thermal conductance between wafer 225 and substrate holder 220. Such a system can be utilized when temperature control of the wafer 225 is required at elevated or reduced temperatures. For example, the backside gas supply system can comprise a two-zone gas distribution system, wherein the helium gas-gap pressure can be independently varied between the center and the edge of wafer 225.

In the embodiment shown in FIG. 2, substrate holder 220 can comprise an electrode 222 through which RF power is coupled to the processing region 245. For example, substrate holder 220 can be electrically biased at a RF voltage via the transmission of RF power from a RF generator 230 through an optional impedance match network 232 to substrate holder 220. The RF electrical bias can serve to heat electrons to form and maintain plasma. In this configuration, the system 200 can operate as an RIE reactor, wherein the chamber and an upper gas injection electrode serve as ground surfaces.

Furthermore, the electrical bias of electrode 222 at a RF voltage may be pulsed using pulsed bias signal controller 231. The RF power output from the RF generator 230 may be pulsed between an off-state and an on-state, for example. Alternately, RF power is applied to the substrate holder electrode at multiple frequencies. Furthermore, impedance match network 232 can improve the transfer of RF power to plasma in plasma processing chamber 210 by reducing the reflected power. Match network topologies (e.g. L-type, π-type, T-type, etc.) and automatic control methods are well known to those skilled in the art.

Gas distribution system 240 may comprise a showerhead design for introducing a mixture of process gases. Alternatively, gas distribution system 240 may comprise a multi-zone showerhead design for introducing a mixture of process gases, and adjusting the distribution of the mixture of process gases above wafer 225. For example, the multi-zone showerhead design may be configured to adjust the process gas flow or composition to a substantially peripheral region above wafer 225 relative to the amount of process gas flow or composition to a substantially central region above wafer 225. In such an embodiment, gases may be dispensed in a suitable combination to form a highly uniform plasma within the chamber 210.

Vacuum pumping system 250 can include a turbo-molecular vacuum pump (TMP) capable of a pumping speed up to about 8,000 liters per second (and greater) and a gate valve for throttling the chamber pressure. In conventional plasma processing devices utilized for dry plasma etching, an 800 to 3,000 liter per second TMP can be employed. TMPs are useful for low pressure processing, typically less than about 50 mTorr. For high pressure processing (i.e., greater than about 80 mTorr), a mechanical booster pump and dry roughing pump can be used. Furthermore, a device for monitoring chamber pressure (not shown) can be coupled to the plasma processing chamber 210.

In an embodiment, the source controller 255 can comprise a microprocessor, memory, and a digital I/O port capable of generating control voltages sufficient to communicate and activate inputs to processing system 200 as well as monitor outputs from plasma processing system 200. Moreover, source controller 255 can be coupled to and can exchange information with RF generator 230, pulsed bias signal controller 231, impedance match network 232, the gas distribution system 240, the gas supply 290, vacuum pumping system 250, as well as the substrate heating/cooling system (not shown), the backside gas supply system 226, and/or the electrostatic clamping system 228. For example, a program stored in the memory can be utilized to activate the inputs to the aforementioned components of processing system 200 according to a process recipe in order to perform a plasma assisted process, such as a plasma etch process or a post heating treatment process, on wafer 225.

In addition, the processing system 200 can further comprise an upper electrode 270 to which RF power can be coupled from RF generator 272 through optional impedance match network 274. A frequency for the application of RF power to the upper electrode can range from about 0.1 MHz to about 200 MHz, in one embodiment. Alternatively, the present embodiments may be used in connection with Inductively Coupled Plasma (ICP) sources, Capacitive Coupled Plasma (CCP) sources, Radial Line Slot Antenna (RLSA) sources configured to operate in GHz frequency ranges, Electron Cyclotron Resonance (ECR) sources configured to operate in sub-GHz to GHz ranges, and others. Additionally, a frequency for the application of power to the lower electrode can range from about 0.1 MHz to about 80 MHz. Moreover, source controller 255 is coupled to RF generator 272 and impedance match network 274 in order to control the application of RF power to upper electrode 270. The design and implementation of an upper electrode is well known to those skilled in the art. The upper electrode 270 and the gas distribution system 240 can be designed within the same chamber assembly, as shown. Alternatively, upper electrode 270 may comprise a multi-zone electrode design for adjusting the RF power distribution coupled to plasma above wafer 225. For example, the upper electrode 270 may be segmented into a center electrode and an edge electrode.

Depending on the applications, additional devices such as sensors or metrology devices can be coupled to the processing chamber 210 and to the source controller 255 to collect real time data and use such real time data to concurrently control two or more selected integration operating variables in two or more steps involving deposition processes, RIE processes, pull processes, profile reformation processes, heating treatment processes and/or pattern transfer processes of the integration scheme. Furthermore, the same data can be used to ensure integration targets including completion of post heat treatment, patterning uniformity (uniformity), pulldown of structures (pulldown), slimming of structures (slimming), aspect ratio of structures (aspect ratio), line width roughness, substrate throughput, cost of ownership, and the like are achieved.

Figure 3:
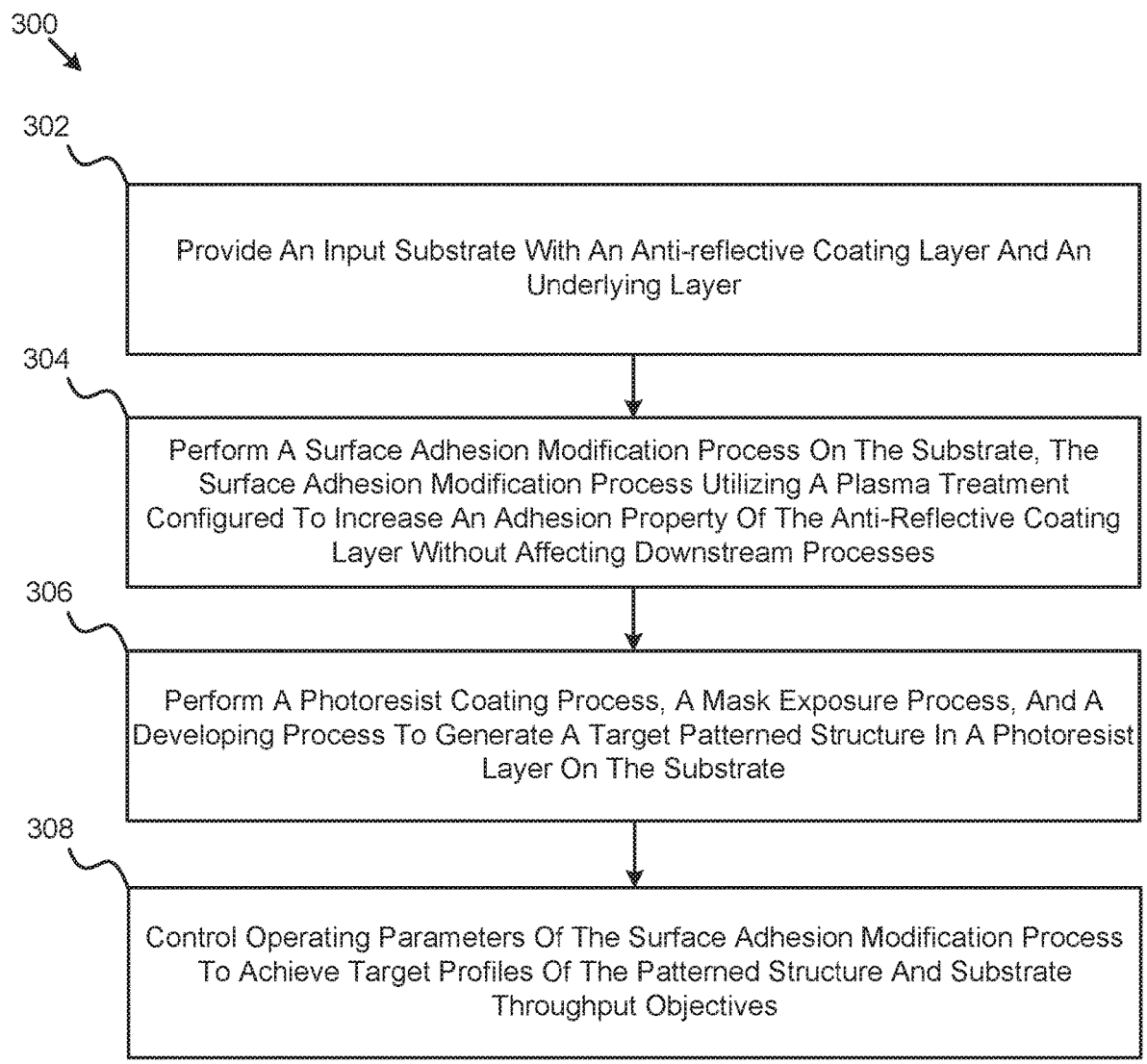
FIG. 3 is a schematic flowchart diagram illustrating one embodiment of a method for plasma treatment to enhance surface adhesion for lithography.

FIG. 3 illustrates one embodiment of a method 300 of patterning using enhancement of surface adhesion. In an embodiment, the method 300 includes providing an input substrate with an anti-reflective coating layer and an underlying layer, as shown at block 302. At block 304, the method 300 includes performing a surface adhesion modification process on the substrate, the surface adhesion modification process utilizing a plasma treatment configured to increase an adhesion property of the anti-reflective coating layer without affecting downstream processes. The method 300 also includes performing a photoresist coating process, a mask exposure process, and a developing process to generate a target patterned structure in a photoresist layer on the substrate as shown at block 306. At block 308, the method 300 includes controlling operating parameters of the surface adhesion modification process to achieve target profiles of the patterned structure and substrate throughput objectives.

Figure 4A:
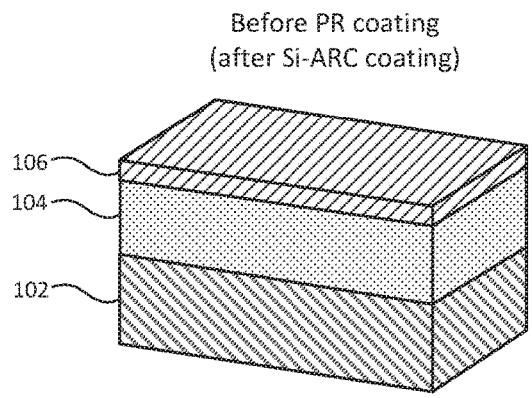
FIG. 4A is a diagram illustrating an embodiment of a structure and process flow step of one embodiment of a process for plasma treatment to enhance surface adhesion for lithography.
Figure 4B:
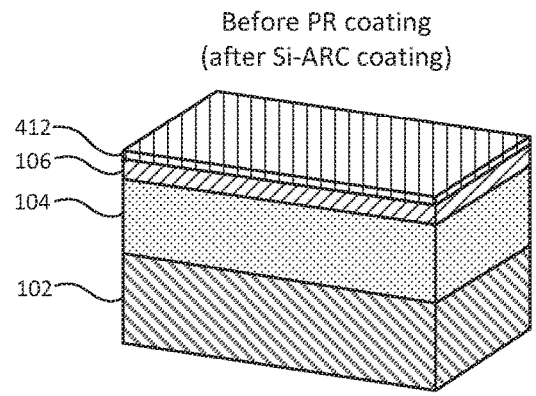
FIG. 4B is a diagram illustrating an embodiment of a structure and process flow step of one embodiment of a process for plasma treatment to enhance surface adhesion for lithography.

An embodiment of a process flow performed according to an embodiment of the method of FIG. 3 is illustrated in FIGS. 4A-4E. As shown in FIG. 4A, the incoming workpiece may have a similar or the same structure as the incoming workpiece described in FIG. 1A. Specifically, the workpiece may include an under layer 102, a spin-on-carbon layer 104, and an anti-reflective coating layer 106, such as Si-ARC. Before the photoresist coating 108 is applied, the workpiece may be treated with plasma to modify a surface of the anti-reflective coating layer 106. The surface modification step shown in FIG. 4B may modify an adhesion property of the anti-reflective layer 106 without affecting downstream processing. In such an embodiment, the photoresist layer 108 may be applied to the modified anti-reflective layer 412, and increased adhesion between the photoresist and anti-reflective layer may result. One result of the increased adhesion may be reduced pattern lifting. Additionally, the resulting process may yield a higher number of correctly formed patterns that limit line merging, open lines, or no-pattern results. Thus, the overall throughput of such processes may be improved. More specifically, such processes may be controlled to achieve target profiles of the patterned structure and substrate throughput objectives that include a pattern collapse margin of 15% or less. Such embodiments may yield reliable results of patterned structures or features that are 10 nm or less.

In such embodiments, on the modified Si-ARC surface 412, the air humidity forms polaric OH-bonds or surface oxidation. In an embodiment, a portion of the under layer 102 such as SiO2, SiN and metallic oxide including Si-ARC are hydrophilic (good adhesion of water), but exhibit poor wetting and adhesion of the unpolaric photoresist. In an embodiment, the surface treatment using $CH_4$ plasma causes hydrophilic surfaces to become more hydrophobic, thus improving the adhesion to photoresist materials. The CxHy radicals in $CH_4$ plasma may bond with Si atoms of the Si-ARC according to such embodiments. Through this response, the chemically-bonded Si—(CH3) groups may form a hydrophobic surface while the surface oxidation is suppressed. Using Fourier transform infrared (FTIR) analysis, new Si—CH3 groups, having a size of around 1261 $cm^{-1}$, after plasma treatment on Si-ARC may be observed. The benefit of increased adhesion yields substantial improvements in production yield and enlarges the margin of lithography process windows.

Figure 4C:
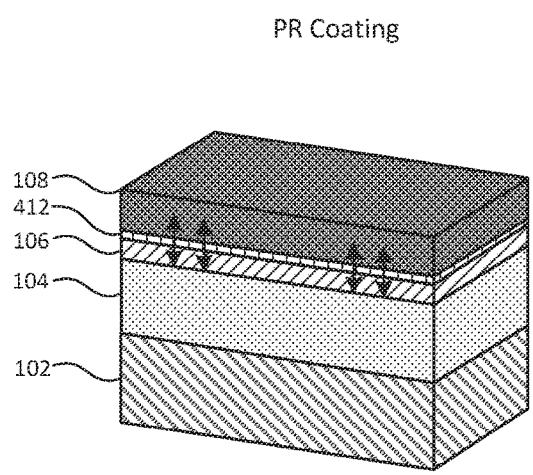
FIG. 4C is a diagram illustrating an embodiment of a structure and process flow step of one embodiment of a process for plasma treatment to enhance surface adhesion for lithography.
Figure 4D:
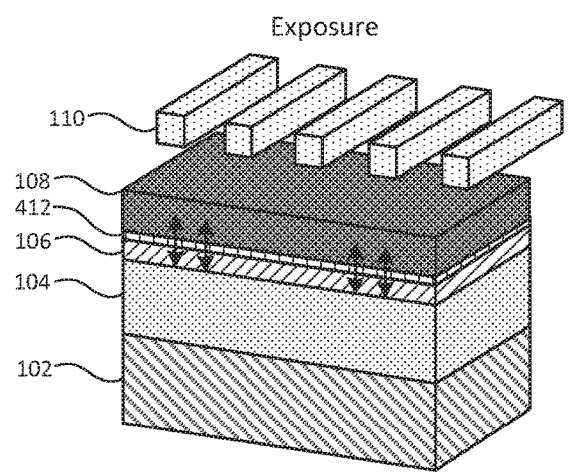
FIG. 4D is a diagram illustrating an embodiment of a structure and process flow step of one embodiment of a process for plasma treatment to enhance surface adhesion for lithography.
Figure 4E:
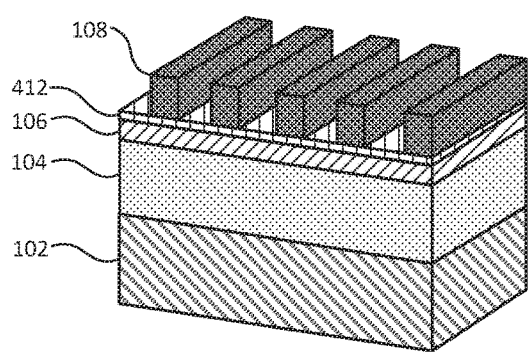
FIG. 4E is a diagram illustrating an embodiment of a structure and process flow step of one embodiment of a process for plasma treatment to enhance surface adhesion for lithography.

In an embodiment, the thickness change of the modified anti-reflective layer is very small, perhaps few nanometers, so it does not effect on following etching process. Then, the wafer follows normal processing flow after surface treatment. For example, FIG. 4C shows the process of applying a photoresist coating 108. The arrows in FIG. 4C indicate increased surface adhesion between the antireflective coating 106 and the photoresist coating 108 because of the modified antireflective surface 412. At step 4D, the photoresist layer 108 is exposed to UV light according to a pattern defined by the mask 110. At step 4E, the photoresist is removed in the areas defined by the pattern, and the remaining patterned photoresist structure has improved structural properties and maintains pattern integrity to a higher degree than the same processes performed without the surface modification step of FIG. 4B.

As shown in FIGS. 5A-5E, an embodiment of a plasma chemistry using $CH_4$ for the plasma treatment and surface modification process may provide suitable results for surface adhesion according to some embodiments.

Figure 6A:
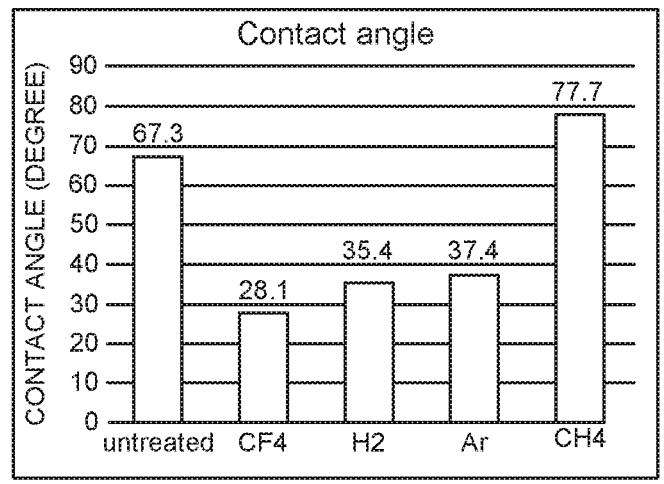
FIG. 6A is a graphical representation of contact angle with water for various embodiment of plasma treatment chemistries.
Figure 6B:
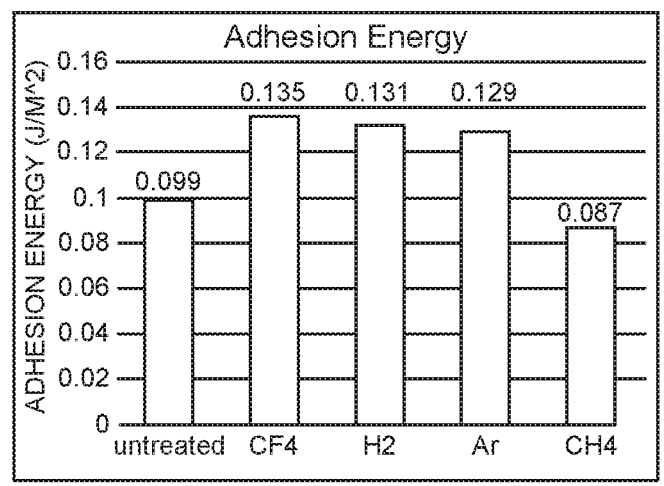
FIG. 6B is a graphical representation of adhesion energy for various embodiments of plasma treatment chemistries.
Figure 7A:
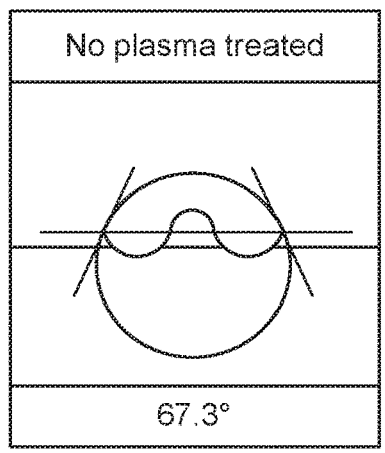
FIG. 7A illustrates contact angle with water for one embodiment of a plasma treatment chemistry.
Figure 7B:
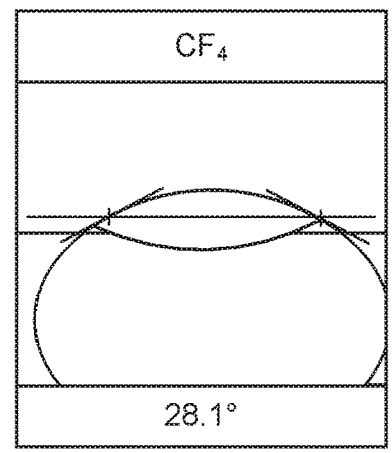
FIG. 7B illustrates contact angle with water for one embodiment of a plasma treatment chemistry.
Figure 7C:
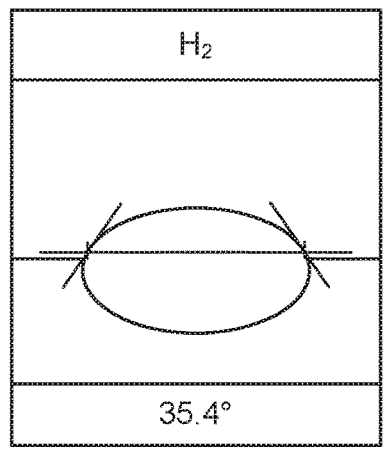
FIG. 7C illustrates contact angle with water for one embodiment of a plasma treatment chemistry.
Figure 7D:
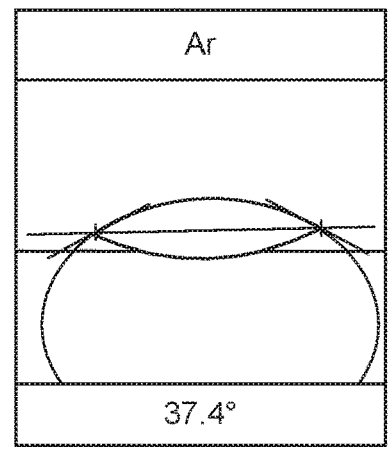
FIG. 7D illustrates contact angle with water for one embodiment of a plasma treatment chemistry.
Figure 7E:
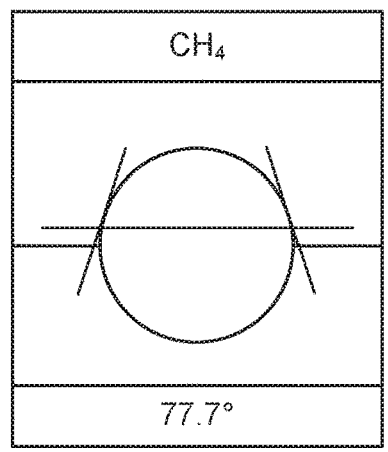
FIG. 7E illustrates contact angle with water for one embodiment of a plasma treatment chemistry.
Figures 8A, 8B:
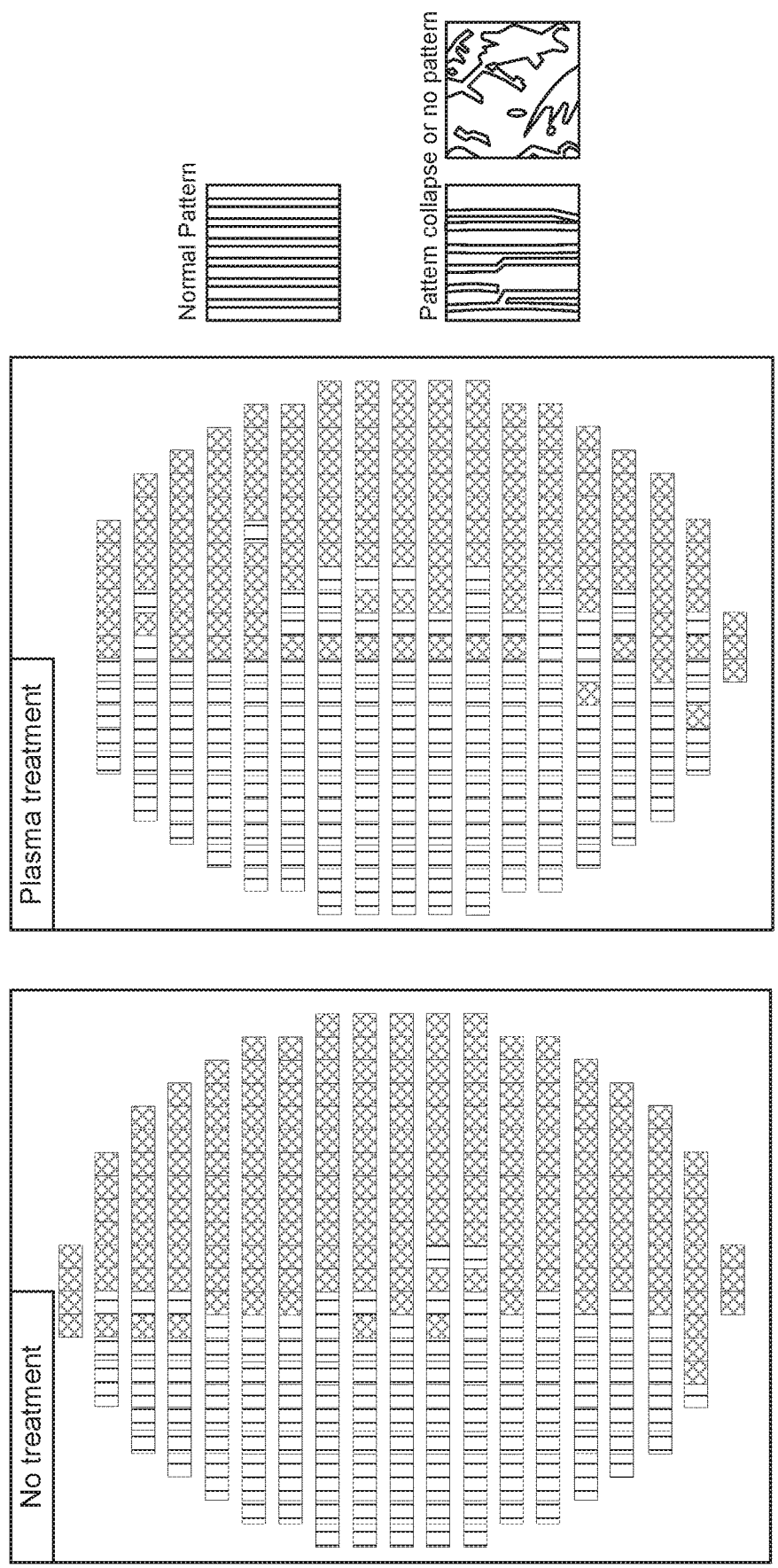
FIG. 8A illustrates an embodiment of pattern collapse of a photoresist layer on an untreated anti-reflective coating.
FIG. 8B illustrates an embodiment of pattern collapse of a photoresist layer on a treated anti-reflective coating.

FIG. 6A-6B illustrate surface adhesion with reference to contact angle of a water droplet deposited on the surface. As shown, $CH_4$ is hydrophobic, exhibiting a contact angle of 77.7 degrees. $CF_4$, $H_2$, and Ar are all hydrophilic, each exhibiting a contact angle less than that of no surface treatment as shown in FIG. 8A. As shown in FIG. 7A to 7F, the baseline contact angle is 67 degrees and the baseline adhesion energy is 0.115 $J/m^2$. An improved process has a contact angle greater than 67 degrees and an adhesion energy below 0.115 $J/m^2$. FIG. 7A illustrates the baseline with no plasma treatment. As shown in FIG. 7B, the contact angle is 28.1 degrees, which indicates that CF4 treatment causes the surface to be more hydrophilic, rather than hydrophobic. Treatments with hydrogen (H2) plasma and argon (Ar) plasma as shown in FIGS. 7C-7D respectively also yield greater hydrophilic behavior in the results. As shown in FIG. 7E, the contact angle is 77.7 degrees, which is greater than that of the baseline, indicating that treatment with CH4 plasma yield a more hydrophobic result than the baseline.

FIGS. 8A-8B illustrate improved throughput with the plasma treatment processes described herein. As illustrated in FIGS. 8A-8B, the number of chips with good patterns on a wafer increased from 139 to 175. This demonstrates that the treatment shows reduction in pattern collapse margin by a range of 15% to 45%. In an embodiment, the plasma treatment used for the result of FIG. 8B may be a CH4 plasma treatment. The CH4 plasma treatment may cause the surface of the substrate to be more hydrophobic, thereby reducing the pattern collapse and other defects of the wafer fabrication process.

Further modifications and alternative embodiments of the inventions will be apparent to those skilled in the art in view of this description. Accordingly, this description is to be construed as illustrative only and is for the purpose of teaching those skilled in the art the manner of carrying out the inventions. It is to be understood that the forms and method of the inventions herein shown and described are to be taken as presently preferred embodiments. Equivalent techniques may be substituted for those illustrated and describe herein and certain features of the inventions may be utilized independently of the use of other features, all as would be apparent to one skilled in the art after having the benefit of this description of the inventions.

What is claimed is:

1. A method of patterning using enhancement of surface adhesion, the method comprising:
    providing an input substrate with an anti-reflective coating layer comprising Si, and an underlying layer, wherein the underlying layer includes a spin-on-carbon layer;
    performing a surface adhesion modification process on the substrate, the surface adhesion modification process utilizing a plasma treatment configured to increase an adhesion property of an anti-reflective coating layer without affecting downstream processes, and wherein the plasma treatment includes bonding CxHy radicals with Si of the anti-reflective coating;
    performing a photoresist coating process, a mask exposure process, and a developing process to generate a target patterned structure in a photoresist layer on the substrate;
    controlling operating parameters of the surface adhesion modification process to achieve target profiles of the patterned structure and substrate throughput objectives.

2. The method of claim 1, wherein the anti-reflective coating layer is a silicon-containing anti-reflective coating (SiARC) layer.

3. The method of claim 1, wherein the substrate throughput objectives include pattern collapse margin.

4. The method of claim 3, wherein controlling operating parameters of the surface adhesion modification process yields a reduction of pattern collapse margin by a range of fifteen (15) percent to forty-five (45) percent.

5. The method of claim 1, wherein the substrate throughput objectives include percent of substrates with pattern lifting, line merging, open line, and/or without a pattern.

6. The method of claim 1, wherein the spin-on-carbon layer comprises at least one of an organic dielectric and an organic planarizing layer.

7. The method of claim 1, wherein the photoresist layer comprises an argon fluoride or an extreme ultra-violet photoresist.

8. The method of claim 1, wherein patterned structures of the substrate are 10 nm or more.

9. The method of claim 1, wherein the operating parameters of the surface adhesion modification process include contact angle and adhesion energy.

10. The method of claim 9, wherein the contact angle is greater than sixty (60) degrees.

11. The method of claim 9, wherein the adhesion energy is less than 0.115 J/m$^2$.

12. A method of patterning using enhancement of surface adhesion, the method comprising:
 providing an input substrate with an anti-reflective coating layer and an underlying layer;
 performing a surface adhesion modification process on the substrate, the surface adhesion modification process utilizing a plasma treatment configured to increase an adhesion property of an anti-reflective coating layer without affecting downstream processes;
 performing a photoresist coating process, a mask exposure process, and a developing process to generate a target patterned structure in a photoresist layer on the substrate, wherein plasma chemistries used in the mask exposure process and the developing process included CH$_4$ gas;
 controlling operating parameters of the surface adhesion modification process to achieve target profiles of the patterned structure and substrate throughput objectives.

13. The method of claim 12, wherein the underlying layer includes a spin-on-carbon layer.

14. A method of patterning using enhancement of surface adhesion, the method comprising:
 providing an input substrate with an adhesion layer and an underlying layer, wherein the adhesion layer comprises Si;
 performing a surface adhesion modification process on the substrate, the adhesion modification process utilizing a plasma treatment configured to increase of adhesion property of the adhesion layer without affecting downstream processes, and wherein the plasma treatment includes bonding CxHy radicals with Si of the adhesion layer;
 performing a photoresist coating process, a mask exposure process, and a developing process to generate a target patterned structure in a photoresist layer on the substrate;
 controlling operating parameters of the surface adhesion modification process to achieve target profiles of the patterned structure and reduced pattern lifting, line merging, open line, and/or line without a pattern.

15. The method of claim 14, wherein the surface adhesion modification process includes conversion of surfaces of the adhesion layer from a hydrophilic to hydrophobic surfaces resulting in increase in substrate throughput.

16. The method of claim 14, wherein the surface adhesion modification process increases adhesion of the adhesion and photoresist layers.

17. The method of claim 14, wherein the operating parameters include contact angle and adhesion energy of liquid on a surface of the substrate.

18. The method of claim 17, wherein the contact angle is in a range from 28 to 78 degrees.

19. The method of claim 17, wherein the adhesion energy is in a range from 0.080 to 0.135 J/m$^2$.

20. The method of claim 17, wherein substrates that achieved target profiles and reduced pattern lifting, line merging, open line, and/or line without a pattern increased by 5% to 25%.

* * * * *